United States Patent
Alpert et al.

(10) Patent No.: US 6,996,512 B2
(45) Date of Patent: *Feb. 7, 2006

(54) PRACTICAL METHODOLOGY FOR EARLY BUFFER AND WIRE RESOURCE ALLOCATION

(75) Inventors: Charles Jay Alpert, Austin, TX (US); Jiang Hu, Austin, TX (US); Paul Gerard Villarrubia, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 909 days.

This patent is subject to a terminal disclaimer.

(21) Appl. No.: 09/838,429

(22) Filed: Apr. 19, 2001

(65) Prior Publication Data

US 2002/0184607 A1 Dec. 5, 2002

(51) Int. Cl.
*G06F 17/50* (2006.01)
*G06F 9/45* (2006.01)

(52) U.S. Cl. .................... 703/14; 716/5; 716/6
(58) Field of Classification Search .......... 703/14; 716/2, 13, 6, 5
See application file for complete search history.

(56) References Cited

U.S. PATENT DOCUMENTS

| 5,838,583 | A | * | 11/1998 | Varadarajan et al. ........... 716/9 |
| 6,009,248 | A | * | 12/1999 | Sato et al. .................... 716/2 |
| 6,117,182 | A | * | 9/2000 | Alpert et al. ................. 716/8 |
| 6,286,128 | B1 | * | 9/2001 | Pileggi et al. ............... 716/18 |
| 6,347,393 | B1 | * | 2/2002 | Alpert et al. ................ 716/2 |
| 6,401,234 | B1 | * | 6/2002 | Alpert et al. ............... 716/13 |
| 6,513,149 | B1 | * | 1/2003 | Donato ....................... 716/12 |
| 6,519,745 | B1 | * | 2/2003 | Srinivas et al. .............. 716/5 |
| 6,519,746 | B1 | * | 2/2003 | Andreev et al. .............. 716/6 |
| 6,591,411 | B2 | * | 7/2003 | Alpert et al. ............... 716/13 |
| 2001/0009031 | A1 | * | 7/2001 | Nitta et al. ................. 716/13 |

OTHER PUBLICATIONS

Cheng-Kok Koh, Paterick H, Madden, "Manhatten or Non-Manhatten? A Study of Alternative VLSI Routing Architectures", ACM 2000, pp. 47-52.*

* cited by examiner

*Primary Examiner*—Paul L. Rodriguez
*Assistant Examiner*—Dwin M. Craig
(74) *Attorney, Agent, or Firm*—Duke W. Yee; Casimer K. Salys; Wing Yan Mok

(57) ABSTRACT

A method, system, and computer program product for allocating buffer and wire placement in an integrated circuit design is provided. In one embodiment, the surface of a integrated circuit design is represented as a tile graph. Allocation of buffer locations for selected tiles in the tile graph is then received and nets are routed between associated sources and sinks. Buffer locations within selected tiles are then selectively assigned based upon buffer needs of the nets, wherein the nets are routed through selected tiles and assigned buffer locations using a cost minimization algorithm.

21 Claims, 8 Drawing Sheets

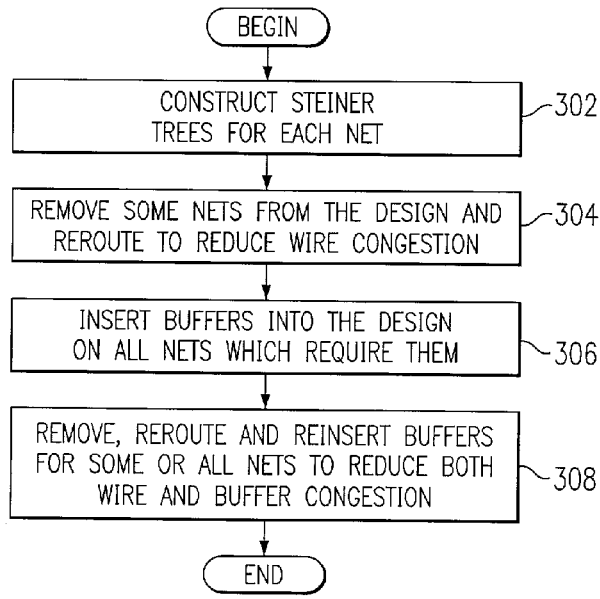
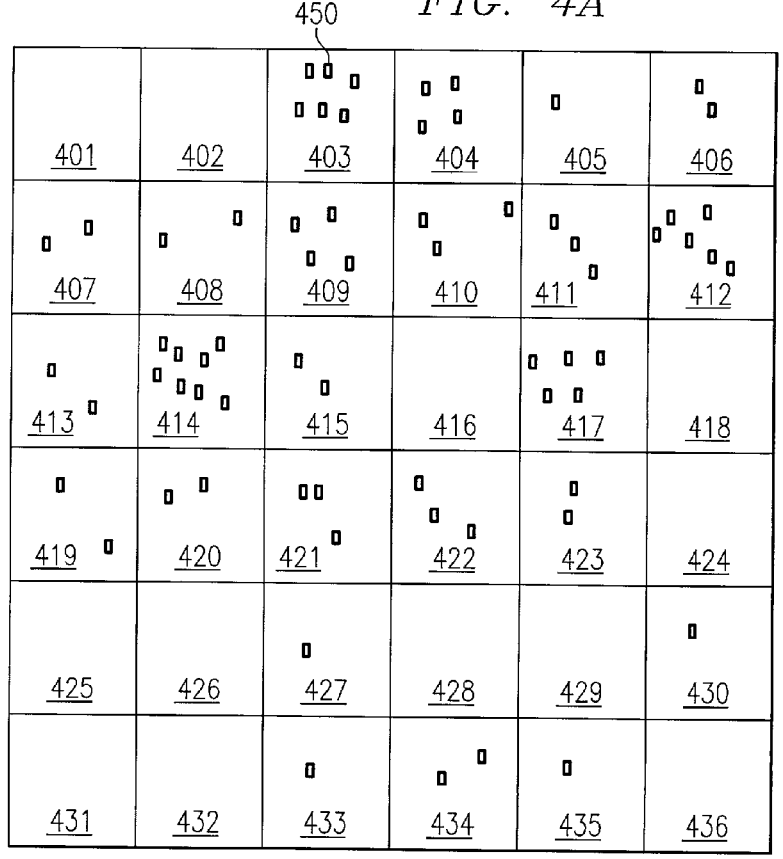

| 0 | 0 | 6 | 4 | 1 | 2 |
|---|---|---|---|---|---|
| 401 | 402 | 403 | 404 | 405 | 406 |
| 2 | 2 | 4 | 3 | 3 | 6 |
| 407 | 408 | 409 | 410 | 411 | 412 |
| 2 | 8 | 2 | 0 | 5 | 0 |
| 413 | 414 | 415 | 416 | 417 | 418 |
| 2 | 2 | 3 | 3 | 2 | 0 |
| 419 | 420 | 421 | 422 | 423 | 424 |
| 0 | 0 | 1 | 0 | 0 | 1 |
| 425 | 426 | 427 | 428 | 429 | 430 |
| 0 | 0 | 1 | 2 | 1 | 0 |
| 431 | 432 | 433 | 434 | 435 | 436 |

FIG. 8
1. SET $c_t[j]=0$ FOR $1 \leq j < L_t$, AND SINK $t$. SET $v=t$
2. WHILE $v \neq s$ DO
   FOR $j=1$ to $L_j-1$ DO
     SET $c_{par(v)}[j]=c_v[j-1]$
   SET $c_{par(v)}[0]=q(par(v))+\min\{c_v[j]\| 0 \leq j < L_j\}$
   SET $v=par(v)$
3. LET $v$ BE SUCH THAT $par(v)=s$. RETURN $\min\{c_v[j]\| 0 \leq j < L_j\}$
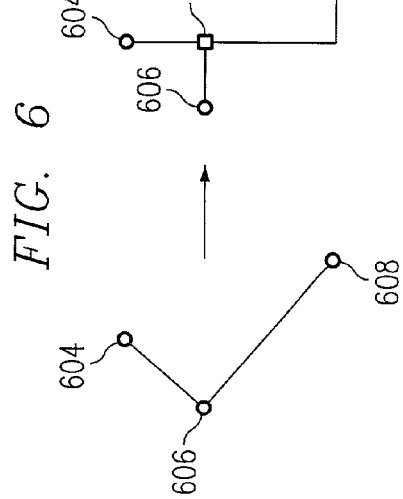
FIG. 6
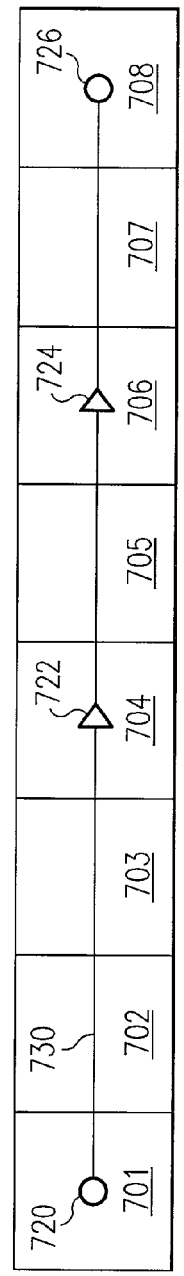
FIG. 7
| 720 | 701 | 730 702 | 703 | 722 704 | 705 | 724 706 | 707 | 726 708 |
|---|---|---|---|---|---|---|---|---|
| B(v) | | 8 | 5 | 12 | 3 | 5 | 0 | |
| b(v) | | 3 | 4 | 2 | 3 | 0 | 0 | |
| p(b) | | 2.5 | 3.6 | 2 | | 4 | 5 | |
| q(v) | | 1.3 | 8.6 | 0.5 | ∞ | 1.0 | ∞ | |

FIG. 11 

1. PICK AN UNVISITED NODE $v$ SUCH THAT ALL DESCENDANTS OF $v$ HAVE BEEN VISITED
   WHILE $v \neq s$ DO 2. IF $v$ IS A SINK THEN
   SET $C_v[j] = 0$ FOR $1 \leq j < L_j$ 3. IF $v$ HAS ONE CHILD $l(v)$ THEN
   FOR $j=1$ TO $L_j.-1$ DO
   SET $C_v[j] = C_{l(v)}[j-1]$
   SET $C_v[0] = q(v) + min\{C_{l(v)}[j] \| 0 \leq j < L_j\}$ 4. IF $v$ HAS TWO CHILDREN $l(v)$ AND $r(v)$ THEN
4.1      FOR $j=2$ TO $L_j.-1$ DO
   SET $C_v[j] = min\{C_{l(v)}[j_l] + C_{r(v)}[j_r] \| j_l + j_r + 2 = j\}$
4.2 SET $C_v[0] = q(v) + min\{C_{l(v)}[j_l] + C_{r(v)}[j_r] \| j_l + j_r + 2 \leq L_j\}$
4.3 SET $C_v[1] = \infty$
4.4 FOR $j=1$ TO $L_j -1$ DO
   SET $C_v[j] = min\{C_v[j], q(v) + C_{l(v)}[j-1], q(v) + C_{r(v)}[j-1]\}$ 5. MARK $v$ AS VISITED
   PICK AN UNVISITED NODE $v$ SUCH THAT ALL DESCENDANTS OF $v$ HAVE BEEN VISITED 6. RETURN $min\{C_s[j] \| 0 \leq j < L_j\}$.

PRACTICAL METHODOLOGY FOR EARLY BUFFER AND WIRE RESOURCE ALLOCATION

BACKGROUND OF THE INVENTION

1. Technical Field

The present invention relates to integrated circuit (IC) chip design and, more particularly, to methods of designing buffer placement in an IC chip.

2. Description of Related Art

Buffer insertion has become a critical step in deep submicron design as interconnect now plays a dominating role in determining system performance. The insertion of buffers and inverters on signal nets can provide several advantages, including reducing interconnect delay, restraining noise, improving the slew rate, and fixing electrical violations. Current designs easily require thousands of nets to be buffered, and it is speculated that close to 800,000 buffers will be required for chip designs in 70 nanometer technology for a microprocessor chip with 500 million transistors.

Achieving timing closure becomes more difficult when buffer insertion is deferred to the back end of the design process, and the buffers must be squeezed into whatever left over space remains. The problem is particularly acute for custom designs, where large IP core macros and custom data flow structures are present, blocking out significant areas from buffering possibilities. Application Specific Integrated Circuit (ASIC) designs can also run into similar headaches if they are dense, or have locally dense hot spots.

To manage the large number of buffers and also achieve high performance on the critical global nets, buffers must be planned for early in the design, so that the rest of the design flow is aware of the required buffering resources. In addition, design routability has also become a critical problem; one must make sure that an achievable routing solution exists during the physical floorplanning stage. Thus, global wiring must be planned early to minimize routing congestion, hot spots, and crosstalk problems later on in the flow.

In response to the need for an interconnect-centric design methodology, a new body of research on buffer block planning has recently established itself in the literature. These works focus on "physical-level interconnect planning.". Many have proposes the creation of additional buffer blocks to be inserted into an existing floorplan. These buffer blocks are essentially top-level macro blocks containing only buffers. One proposed implementation of this method is the construction of these blocks using feasible regions. A feasible region is the largest polygon in which a buffer can be inserted for a particular net such that the net's timing constraint is satisfied. Others have added a notion of independence to the feasible regions while also trying to relieve routing congestion during optimization. Still others propose an optimal buffer block planning algorithm in terms of maximizing the number of inserted buffers (assuming that one buffer is sufficient for each net). Finally, still others present a multi-commodity flow-based approach to buffering 2-pin nets assuming that a buffer block plan had already been created. This approach has been extended to multi-pin nets in.

With reference now to FIG. 1, a diagram showing the result of buffer block planning based on physical-level interconnect planning on a circuit is depicted in accordance with the prior art. The buffer blocks 121–133 are indicated by dashes in between macro functional blocks 101–110. Observe that buffers 121–133 are essentially packed between larger existing floorplanned functional blocks 101–110. There are two fundamental problems with this buffer block planning approach:

I. Since buffers are used to connect global wires, there will be considerable contention for routing resources (i.e. the number of wiring tracks) in the regions between macro functional blocks 101–110. For any given rectangular region, there are a fixed number of wiring tracks that can be used in that region. Thus, only a fixed number of wires can go through the region. As more and more wires are needed, it is the routing resources that become contentious. Therefore, the design may not be routable due to heavy congestion between functional blocks 101–110.

II. Buffers must be placed in poor locations since better locations are blocked. Some functional blocks 101–110 may even be so large that routing over the functional block 101–110 is infeasible, even if buffers are inserted immediately before and after the functional block 101–110. For example, signal integrity could degrade beyond the point of recovery or wire delay may simply be too high. One may be able to alleviate the problem by using wider wires on thick metal, powering up to very large buffers, etc., but these solutions exacerbate the congestion problem.

The flaws are not with buffer block planning per se; rather, it is certainly a reasonable method for pre-planning buffers within current design flows. However, buffer block planning is really an interconnect-centric idea being applied to a device/logic-centric flow. Ultimately this methodology will not be sustainable as design complexity continues to increase. A different methodology is required.

Ideally, buffers should be dispersed with some regularity throughout the design. Clumping buffers together, e.g., in buffer blocks, or between abutting macros invites routing headaches. A more uniform distribution of buffers will also naturally spread out global wires. Therefore, a method of buffer block design that allows placement of buffers within functional blocks is desirable.

SUMMARY OF THE INVENTION

The present invention provides a method, system, and computer program product for allocating buffer and wire placement in an integrated circuit design. In one embodiment, the surface of a integrated circuit design is represented as a tile graph. Allocation of buffer locations for selected tiles in the tile graph is then received and nets are routed between associated sources and sinks. Buffer locations within selected tiles are then selectively assigned based upon buffer needs of the nets, wherein the nets are routed through selected tiles and assigned buffer locations using a cost minimization algorithm.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 3 depicts a process flow and program function for buffer and wire resource allocation and design in accordance with the present invention;

FIG. 4A depicts a tile graph illustrating a chip surface divided into tiled regions in accordance with the present invention;

FIG. 6 shows a Steiner point introduced to remove the overlap between a source and two sinks in accordance with the present invention;

FIG. 7 depicts a diagram illustrating how buffer cost is computed in accordance with the present invention;

FIG. 8 depicts a diagram illustrating a single-sink buffer insertion algorithm in accordance with the present invention;

FIG. 11 depicts a multi-sink buffer insertion algorithm in accordance with the present invention.

DETAILED DESCRIPTION OF THE PREFERRED EMBODIMENT

Figure 1:
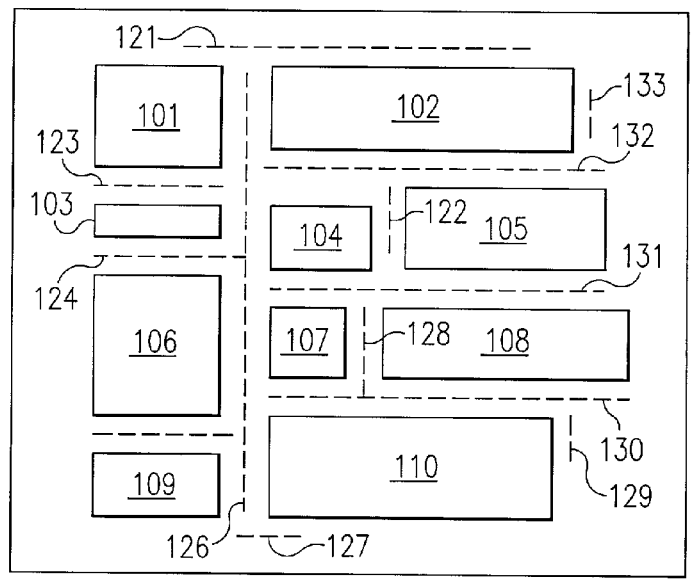
FIG. 1 depicts a diagram showing the result of buffer block planning based on physical-level interconnect planning on a circuit in accordance with the prior art.
Figure 2:
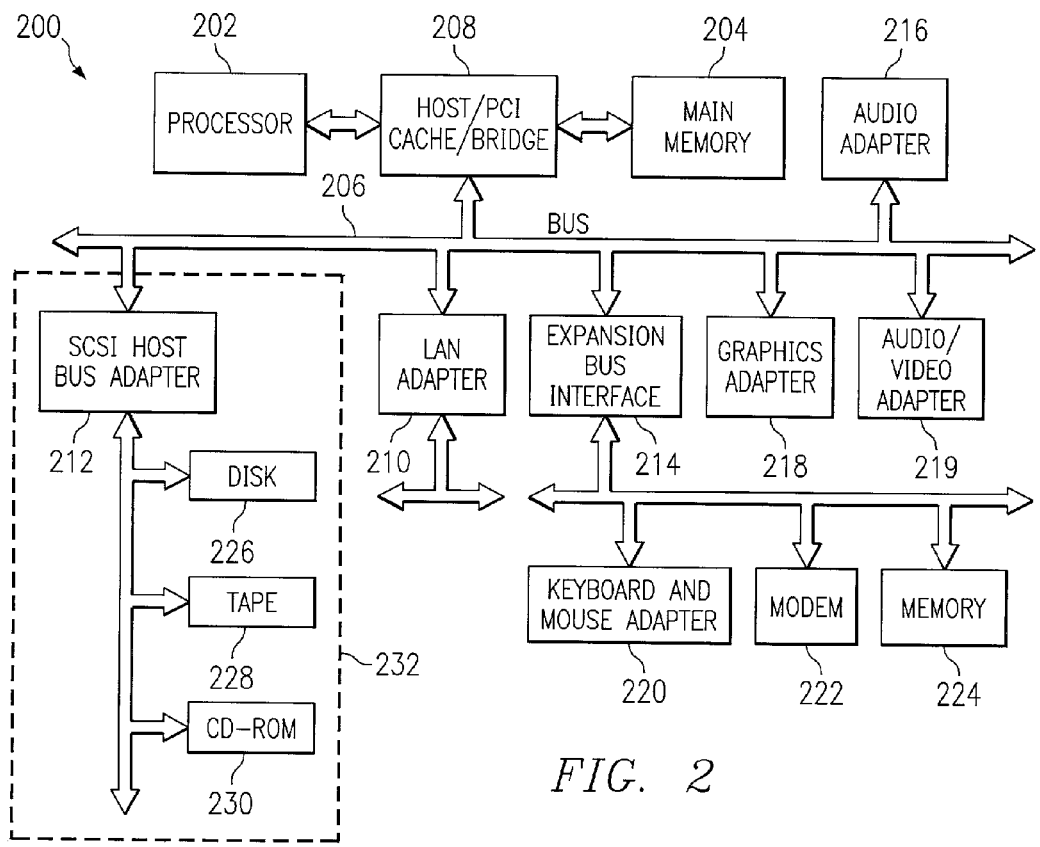
FIG. 2 depicts a block diagram illustrating a data processing system in which the present invention may be implemented.

With reference now to FIG. 2, a block diagram illustrating a data processing system is depicted in which the present invention may be implemented. Data processing system 200 is an example of a data processing system that may be used to implement a computer program product for designing buffer block placement in an integrated circuit chip in accordance with the present invention. Data processing system 200 employs a peripheral component interconnect (PCI) local bus architecture. Although the depicted example employs a PCI bus, other bus architectures such as Accelerated Graphics Port (AGP) and Industry Standard Architecture (ISA) may be used. Processor 202 and main memory 204 are connected to PCI local bus 206 through PCI bridge 208. PCI bridge 208 also may include an integrated memory controller and cache memory for processor 202. Additional connections to PCI local bus 206 may be made through direct component interconnection or through add-in boards.

In the depicted example, local area network (LAN) adapter 210, SCSI host bus adapter 212, and expansion bus interface 214 are connected to PCI local bus 206 by direct component connection. In contrast, audio adapter 216, graphics adapter 218, and audio/video adapter 219 are connected to PCI local bus 206 by add-in boards inserted into expansion slots. Expansion bus interface 214 provides a connection for a keyboard and mouse adapter 220, modem 222, and additional memory 224. Small computer system interface (SCSI) host bus adapter 212 provides a connection for hard disk drive 226, tape drive 228, and CD-ROM drive 230. Typical PCI local bus implementations will support three or four PCI expansion slots or add-in connectors.

An operating system runs on processor 202 and is used to coordinate and provide control of various components within data processing system 200 in FIG. 2. The operating system may be a commercially available operating system, such as Windows 2000, which is available from Microsoft Corporation. An object oriented programming system such as Java may run in conjunction with the operating system and provide calls to the operating system from Java programs or applications executing on data processing system 200. "Java" is a trademark of Sun Microsystems, Inc. Instructions for the operating system, the object-oriented operating system, and applications or programs are located on storage devices, such as hard disk drive 226, and may be loaded into main memory 204 for execution by processor 202.

Those of ordinary skill in the art will appreciate that the hardware in FIG. 2 may vary depending on the implementation. Other internal hardware or peripheral devices, such as flash ROM (or equivalent nonvolatile memory) or optical disk drives and the like, may be used in addition to or in place of the hardware depicted in FIG. 2. Also, the processes of the present invention may be applied to a multiprocessor data processing system.

As another example, data processing system 200 may be a stand-alone system configured to be bootable without relying on some type of network communication interface, whether or not data processing system 200 comprises some type of network communication interface.

The depicted example in FIG. 2 and above-described examples are not meant to imply architectural limitations. For example, data processing system 200 also may be a notebook computer.

The present invention presents an alternative methodology to buffer block placement. It should be noted that as used herein, the term buffer refers to buffers for signal nets and not to clocked buffers. Compared to generic buffers, clocked buffers occupy more area, draw more current, and create hot spots, all of which requires different constraints and objectives than do net buffers.

Macro function block designers must allow global buffer and wiring resources to be interspersed within their designs wherever possible. This resource allocation need not be uniform; a function block with a lower performance requirement and complexity may be able to afford to allocate a higher percentage of its resources. A cache or function blocks within a datapath may not be able to allocate any resources.

To set aside a buffer resource within a block, the designer can insert what is referred to herein as a buffer site, i.e., physical area which can denote either a buffer, inverter (with a range of power levels), or even a decoupling capacitor. When a buffer site gets assigned to a net, a logical gate from the technology is actually specified. A net is simply a set of cells or pins to be connected together. These pins can be classified as either drivers or sinks. Each net has one driver and one or more sinks. A single-sink net has exactly one sink while a multi-sink net has two or more sinks. A net exists whether or not the blocks are placed before wiring. A "routed net" or "Steiner route" or "routing" refers to the wiring between placed cells/pins of the net. Until this assignment takes place, buffer sites are not connected to any nets.

Allocating a percentage of a macro block for buffer sites may be viewed as wasteful; however, if the sites are not used for buffering there are other ways to utilize them. For example, they can be populated with spare circuits to facilitate metal-only engineering changes late in the design cycle. Or, the sites can be populated with decoupling capacitors to enhance local power supply and signal stability. Thus, one can actually afford to allocate many more buffer sites than will ever be used.

Buffer sites can also be a powerful tool for semi-custom designs. For example, in a data flow there are typically regular signal buses routed across collections of data flow elements. These routes are generally expected to be implemented with straight wires if possible. If buffering for some or all of the strands of a data bus are required, it is important to have buffer locations available within the data path itself. If buffer sites are designed into the original data path layout, it is possible to add buffers late in the design cycle while maintaining straight wiring of the buses.

Buffer sites can also be used for a flat design style, e.g., a sea of buffer sites can be sprinkled throughout the placement. For hierarchical designs, one can view the buffer sites as flat to derive a similar sprinkling, but their distribution will likely be less uniform. Some regions could have, say, 5–10% of the area devoted to buffer sites, while a region containing the cache will have none. No matter which design style is used, a resource allocation algorithm can view buffer sites as flat, which enables it to make assignments to global routes based on buffer site distribution.

With reference now to FIG. 3, a process flow and program function for buffer and wire resource allocation and design is depicted in accordance with the present invention. Assuming that locations for buffer sites have already been chosen, the problem is to assign buffers to global nets such that each buffer corresponds to an existing buffer site. The problem may be modeled with a tile graph to manage the complexity of thousands of buffer sites and to integrate wire congestion into the problem statement.

To begin, low-cost, low-radius Steiner trees are constructed for each net (step 302). Next, some nets are removed from the design and re-routed to reduce wire congestion (step 304). Buffers are then inserted into the design on all nets which require them (step 306). This stage is based on a van Ginneken style dynamic programming algorithm, yet the present invention can find the optimal solution for a given net more efficiently than van Ginneken. (See van Ginneken, "Buffer Placement in Distributed RC-tree Networks for Minimal Elmore Delay", *International Symposium on Circuits and Systems*, 1990, pp. 865–868.) The final step is to remove, reroute, and reinsert buffers for some or all nets to reduce both wire and buffer congestion (step 308). Unlike many prior art approaches, the present invention is designed to handle nets with multiple sinks.

Turning now to a formulation of the problem, there are two fundamental characteristics of buffer and wire planning which drive our formulation. First, finding the absolute optimal locations for a buffer is not particularly important. It has been shown that one may be able to move a buffer a considerable distance from its ideal location while incurring a fairly small delay penalty. The concept of feasible regions for buffer insertion is based on the principle that there is a wide range of reasonably good buffer locations.

Second, at the interconnect-centric floorplanning stage, timing constraints are generally not available since macro block designs are incomplete and global routing and extraction have not been performed. Potentially crude timing analysis could be performed, but the results are often grossly pessimistic because interconnect synthesis has not taken place. At this stage, one needs to globally insert buffers while tracking wire congestion before the floorplan can even be evaluated. For example, in a design with a desired 5 nanosecond (ns) clock period, say that one floorplan has a worst slack of −40 ns while a different floorplan has a worst slack of −43 ns. The designer cannot determine which floorplan is better because the slacks for both are so absurdly far from their targets. Buffer and wire planning must be efficiently performed first, then the design can be timed to provide a meaningful worst slack timing that the designer can use for evaluation. The present invention envisions performing buffer and wire planning each time the designer wants to evaluate a floorplan.

The first characteristic suggests that one does not need to worry about exactly where buffer sites are placed. The block designers should have the freedom to sprinkle buffer sites into their designs so that performance is not compromised; there just needs to be a sufficient number of buffer sites somewhere.

Figures 4B, 5:
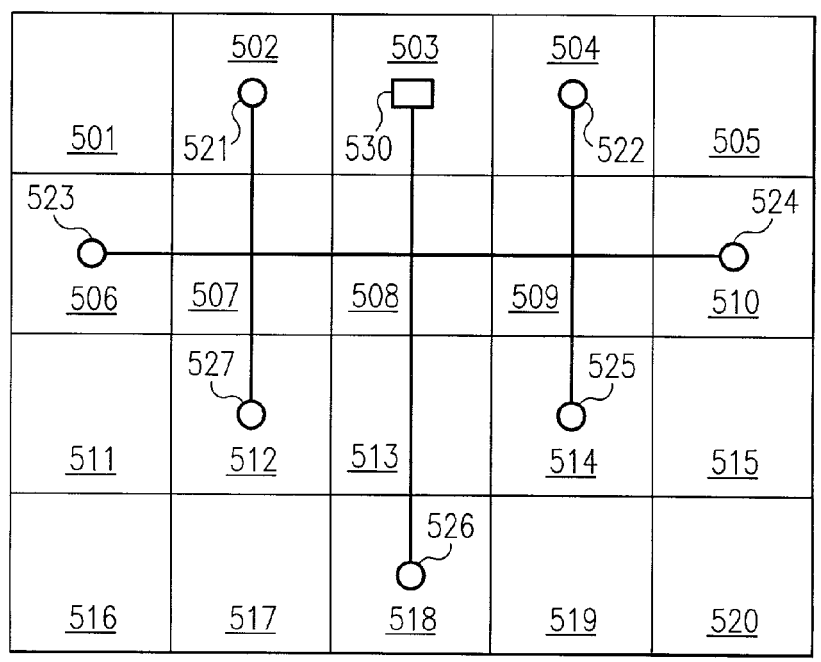
FIG. 4B depicts the tile graph of FIG. 4A with the buffer sites abstracted to a set of buffer sites lying at the center of each tile represented by a number which indicates the total number of buffers within a tile in accordance with the present invention.
FIG. 5 shows a representation of a chip surface divided into tiles with a driver connected to seven sinks.

The optimization algorithm of the present invention can view the thousands of buffer sites within a tile graph. Referring now to FIG. 4A a tile graph illustrating a chip surface divided into tiled regions is depicted in accordance with the present invention. The chip surface is divided into tiled regions 401–436 and shows 68 buffer sites 450 lying within the region of the chip. Referring to FIG. 4B, the tiling over the chip's area can be used to abstract each individual buffer site to a set of buffer sites lying at the center of each tile. Thus, in FIG. 4B, each tile 401–436 has a number which represents the number of buffer sites in that particular tile. After a buffer 450 is assigned to a particular tile 401–436, an actual buffer site can be allocated as a post-processing step. Note that several tiles 401, 402, 416, 418, 424–426, 428, 429, 431, 432, and 436 have zero buffer sites. These might correspond to a cache, datapath or other critical part of the design of the chip for which buffer sites cannot be inserted. Having some zero buffer site tiles is not prohibitive, but too many will obviously hinder solution quality.

The tile graph offers both a complexity reduction advantage (especially when there are thousands of buffer sites) and also the ability to manage routing congestion across tile boundaries. The granularity of the tiling depends on the desired accuracy/runtime trade-off and on the current stage in the design flow.

The second characteristic suggests that timing constraints are not dependable in the early floorplanning stage. The present invention relies on a global rule of thumb for the maximum distance between consecutive buffers. This rule of thumb was also used for buffer planning by Dragan et al., "Provably Good Global Buffering Using an Available Buffer Block Plan", to appear in *IEEE/ACM Intl. Conf. on Computer-Aided Design*, pp. 104–109, 2000. They note that for a high-end microprocessor design in 0.25 micron ($\mu$m) CMOS technology, repeaters are required at intervals of at most 4500 $\mu$m. Such a rule is necessary to ensure that the slew rate is sufficiently sharp at the input to all gates.

A tiling is represented by a graph G(V,E) where V is the set of tiles and edge $e_{u,v}$ is in E if u and v are neighboring tiles. Given a tile v, let B(v) be the number of buffer sites within the tile. Let N={$n_1, n_2, \ldots, n_m$} be the set of global nets and let W($e_{u,v}$) be the maximum permissible number of wires that can cross between u and v without causing overflow. If b(v) denotes the number of buffers assigned to v, the buffer congestion for v is given by b(v)/B(v). Similarly, given a global routing of N, if w($e_{u,v}$) denotes the number of wires which cross between tiles u and v, the wire congestion for edge $e_{u,v}$ is given by w($e_{u,v}$)/W($e_{u,v}$).

For net $n_i$, let $L_i$ be the maximum wirelength, in units of tiles, that can be driven by either the driver of $n_i$ or a buffer inserted on $n_i$. This interpretation of maximum distance avoids the scenario that could occur in FIG. 5. FIG. 5 shows a representation of a chip surface divided into tiles 501–520 with a driver 530 in tile 503 connected to seven sinks 521–527. The distance between the driver 530 and each sink 521–527 is three tile units. Using this interpretation of the distance constraint results in a legal solution where the source gate drives eleven tile units of wirelength without requiring any buffers. For a slew-based distance rule, the extra interconnect (and sink load) will likely cause weak signals at the sinks 521–527. Thus, our distance rule requires that the total amount of interconnect that can be driven by any gate is no more than $L_i$.

Given a tiling of the chip area G(V,E), nets N=={$n_1$, $n_2$, ..., $n_m$}, the number of buffer sites B(v), and tile length constraints $L_i$, assign buffers to nets such that:

I. b(v)≦B(v) for all v∈V, where b(v) is the number of buffers assigned to tile v.

II. Each net $n_i$∈N satisfies its tile length constraint, $L_i$.

III. There exists a routing after buffering such that for all $e_{u,v}$∈E, the number of wires crossing from u to v is less than or equal to W($e_{u,v}$).

In general, the same number of tiles $L_i$ will be used for each net. However, if some nets can be routed on higher metal layers while others cannot, different nets can have different $L_i$ values depending on their layer. Also, a larger value of $L_i$ can be used in conjunction with wider wire width assignment.

A solution to this problem means that constraints are satisfied, though secondary objectives can also be optimized, such as total wirelength, maximum and average wire congestion, maximum and average buffer congestion, and net delays. The heuristic approach of the present invention offers a solution which satisfies the problem formulation while also minimizing these secondary objectives.

Note that the purpose of this formulation should not be used to find the final buffering and routing design. Rather, it can be used to estimate needed buffering and routing resources or as a precursor to timing analysis for more accurate floorplan evaluation. Once deeper into the physical design flows, nets which generate suboptimal performance or are in timing-critical paths should be re-optimized using more accurate values of timing constraints and wiring capacitances.

Turning now to the buffer and wire planning heuristic of the present invention, the heuristic of the present invention allows buffer and wire planning to be integrated into a tile-based global routing methodology. The present invention, as discussed above in relation to FIG. 3, proceeds in four stages: initial Steiner tree construction (step 302), wire congestion reduction (step 304), buffer assignment (step 306), and final post processing (step 308). Steps 306 and 308 provide significant innovations over the prior art and handle buffer site assignment. Steps 302 and 304 deliver an initial congestion-aware global routing solution as a starting point. Alternatively, one could begin with the solution from any global router, e.g., the multi-commodity flow-based approach described by C. Albrecht, "Provably Good Global Routing by a New Approximation Algorithm for Mutlicommodity Flow", *Proc. International Symposium on Physical Design*, 2000, pp. 19–25 which is incorporated herein by reference for all purposes.

At the first stage (step 302), an initial routing of each net is desired so that congested regions can be evaluated and reduced in each stage. As opposed to a pure minimum length construction, the tree should be timing-driven, yet timing constraints are not necessarily available. Hence, in one embodiment of the present invention, the Prim-Dijkstra construction is adopted which generates a hybrid between a minimum spanning tree and shortest path tree. (For more information on the Prim-Dijkstra construction see Alpert, et al., "Prim-Dijkstra Tradeoffs for Improved Performance-Driven Routing Tree Design", *IEEE Transactions on Computer-Aided Design*, 14(7), 1995, pp. 890–896 which is hereby incorporated by reference for all purposes.) The result is a spanning tree which trades off between radius and wirelength. The trade-off requires a user parameter between 0 and 1, where a lower number emphasizes wirelength, while a higher number emphasizes path length.

The spanning tree is then converted to a Steiner tree via a greedy overlap removal algorithm. The algorithm iteratively searches for the two tree edges with the largest potential wirelength overlap. A Steiner point 602 is introduced to remove the overlap between source 604 and sinks 606 and 608 as shown in FIG. 6. The algorithm terminates when no further overlap removal is possible.

The next step following the Steiner Tree construction is to rip-up and reroute to reduce wire congestion (step 304). The tile graph G(V,E) is constructed from the existing Steiner routes, and the congestion of each edge in E is computed. Instead of ripping up nets in congested regions, we rip-up and reroute every net, similar in spirit to Nair's method. (See R. Nair, "A Simple yet Effective Technique for Global Wiring", *IEEE Transactions on Computer-Aided Design*, CAD-6(2), 1987, pp. 165–172. This approach is less likely to become trapped in a local minima. The net ordering is first fixed (for example, sort in order of smallest to largest delays), and each net is processed in turn according to the ordering. The advantage is that even nets which do not violate congestion constraints can be improved to further reduce congestion so that other nets can be successfully re-routed in subsequent iterations. The algorithm terminates after either three complete iterations or w($e_{u,v}$)/W($e_{u,v}$)≦1 for all $e_{u,v}$ ∈ E. From experience, only nominal potential improvement exists after the third iteration.

To reroute the net, the entire net is deleted and then re-routed using an approach similar to that described by C. Chiang, et al., "A Powerful Global Router Based on Steiner min-max Trees", *IEEE/ACM Intl. Conf. on Computer-Aided Design*, 1989, pp. 2–5 which is hereby incorporated by reference for all purposes, as opposed to rerouting one edge. The new tree is constructed on the tile graph using the same Prim-Dijkstra cost function in step 302, except that the cost for each edge is not its Manhattan distance. A Prim-Dijkstra cost function is a trade off between distance from driver to sink and total tree cost and is a combination of Prim's algorithm and Dijkstra's algorithm, both of which are well known in the art. Prim's algorithm provides a method for constructing the minimum cost tree and Dijkstra's algorithm provides a method to construct the minimum distance tree. The Manhattan distance for two points identified by Cartesian coordinates (x1,y1) and (x2,y2) is given by |x1−x2|+|y1−y2|. The routing occurs across the tile graph using the following congestion-based cost function:

$$t(e_{u,v}) = \begin{cases} \dfrac{w(e_{u,v})+1}{W(e_{u,v}) - w(e_{u,v})} & \text{if } \dfrac{w(e_{u,v})}{W(e_{u,v})} < 1 \\ \infty & \text{otherwise} \end{cases}$$

The cost is the number of wires that will be crossing $e_{u,v}$ divided by the number of wires still available. The purpose of this cost is to have the penalty become increasingly high as the edge comes closer to full capacity. The procedure performs a wave-front expansion from the tile which contains the source, updating to the lowest tile cost with each expansion. When each sink in the net is reached, the algorithm terminates, and the tree is recovered by tracing back the edges to the source from each sink.

Once a low congestion routing exists, the next step assigns buffer sites to each net. This assignment is performed iteratively in order of net delay, starting with the net with highest delay. Before buffers are assigned, the probability of a net occupying a tile is first estimated. For a net $n_i$ passing through tile v, the probability of a buffer from v being inserted onto $n_i$ is defined as $1/L_i$. Let p(v) be the sum of these probabilities for tile v over all unprocessed nets. Recall that B(v) is the number of buffer sites in v and b(v) is the current number of used buffer sites. We define the cost q(v) for using a particular buffer site as:

$$q(v) = \begin{cases} \frac{b(v) + p(v) + 1}{B(v) - b(v)} & \text{if } \frac{b(v)}{B(v)} < 1 \\ \infty & \text{otherwise} \end{cases} \quad (2)$$

Observe the similarity between Equations (2) and (1). Both significantly increase the penalty as resources become more contentious.

With reference now to FIG. 7, a diagram illustrating how buffer cost is computed is depicted in accordance with the present invention. Note that the p(v) values do not include the currently processed net. The cost q(v) is computed for each tile, and q(v) is included in the cost for a net if a buffer is inserted at v. In the example, if $L_i=3$, the minimum cost solution has buffers in the third and fifth tiles, with cost 0.5+1.0=1.5.

An optimal solution can be found in linear time in terms of the number of tiles spanned by the net (assuming that $L_i$ is constant). The approach uses a Van Ginneken style dynamic programming algorithm, but has lower time complexity because the number of candidates for each node is at most $L_i$.

To begin, consider the simple case having a net $n_i$ with a single source s and sink t. Let par(v) be the parent node of tile v in the route and assume that q(v) has been computed for all nodes on the path between s and t. At each node v, the array $C_v$ stores the cost of the solutions from v to t. The index of the array determines the distance downstream from v to the last buffer inserted. Thus, the array is indexed from 0 to $L_i-1$, since v cannot be at a distance more than $L_i$ from the last available buffer.

Thus, with reference now to FIG. 8, a diagram illustrating a single-sink buffer insertion algorithm is depicted in accordance with the present invention. The algorithm depicted in FIG. 8 may be used to implement step 306 in FIG. 3 for single sink nodes. Step 1 initializes the cost array $C_t$ to zero for the sink t. In step 2, the algorithm then traverses up towards the source, iteratively setting the values for the cost array. Step 3 computes the values for par(v) given the values for v. The value of $C_{par(v)}[j]$ for j>0 is simply $C_v[j-1]$ since no buffer is being inserted at v for this case. If a buffer is to be inserted at par(v), then the cost $C_{par(v)}[0]$ is computed by adding the current cost for insertion, q(par(v)), to the lowest cost seen at v. One can recover the solution by storing at par(v) the index in $C_v$ which was used to generate the solution.

Figure 9:
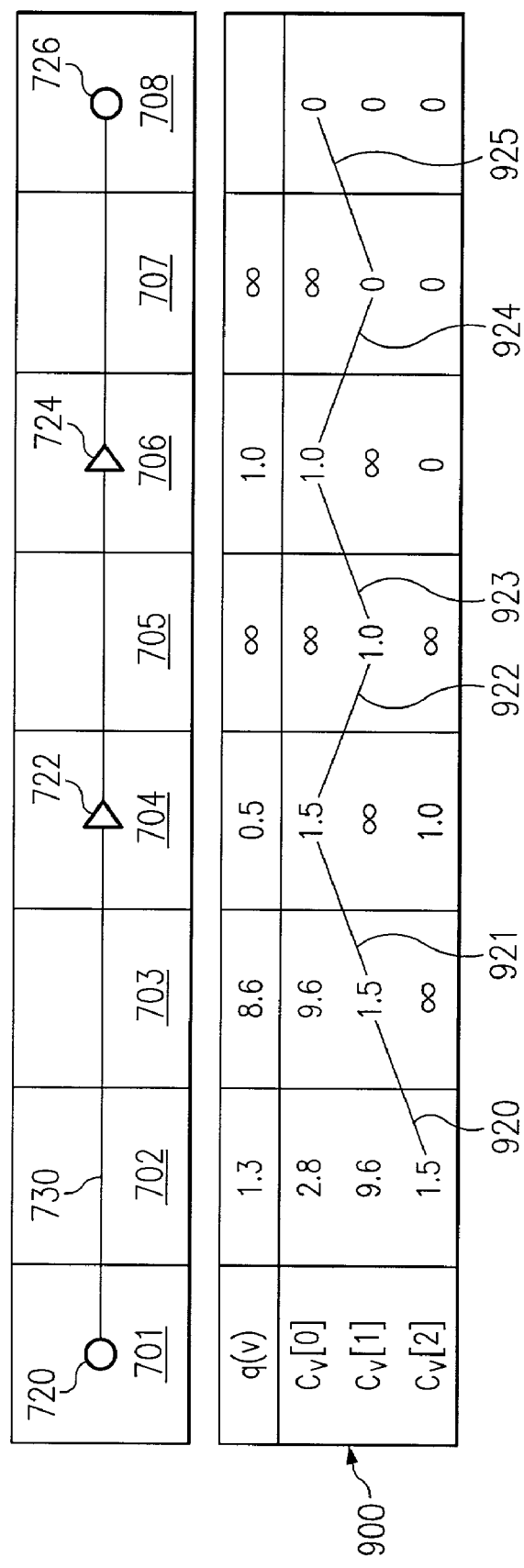
FIG. 9 depicts a diagram illustrating how the cost array is computed using the algorithm depicted in FIG. 8 for the 2-pin example in FIG. 7 (with $L_t=3$) in accordance with the present invention.

With reference now to FIG. 9, a diagram illustrating how the cost array is computed using the algorithm depicted in FIG. 8 for the 2-pin example in FIG. 7 (with $L_i=3$) is depicted in accordance with the present invention. The dark lines 920–925 show how to trace back the solution. Observe from the table 900 that costs are shifted down and to the left as one moves from right to left, with the exception of entries with index zero.

The algorithm is optimal since each possible solution is preserved during the execution. One can take advantage of the fact that the number of possible candidates at each node is no more than $L_i$ to give a space and time complexity of $O(nL_i)$, where n is the number of tiles spanned by the net. This is a significant advantage over similar dynamic programming approaches which have at least $O(n^2)$ time complexity.

Figure 10A:
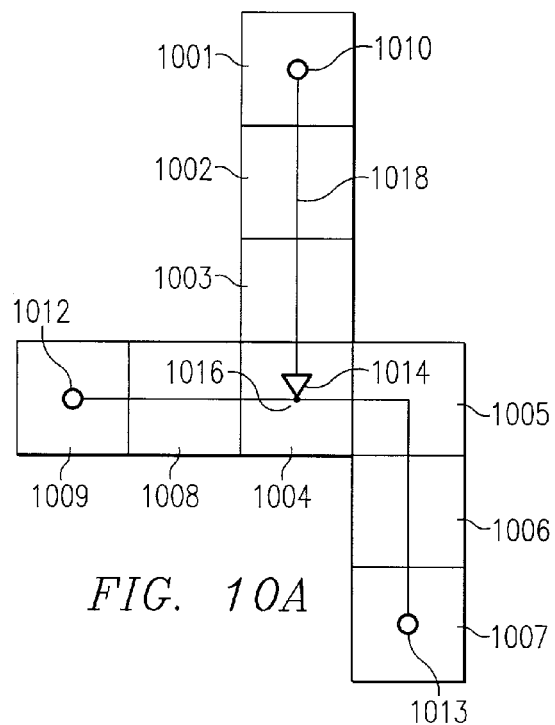
FIGS. 10A–10C depict diagrams illustrating the three possible scenarios for buffer insertion when considering buffer insertion at a node with two children.
Figure 10B:
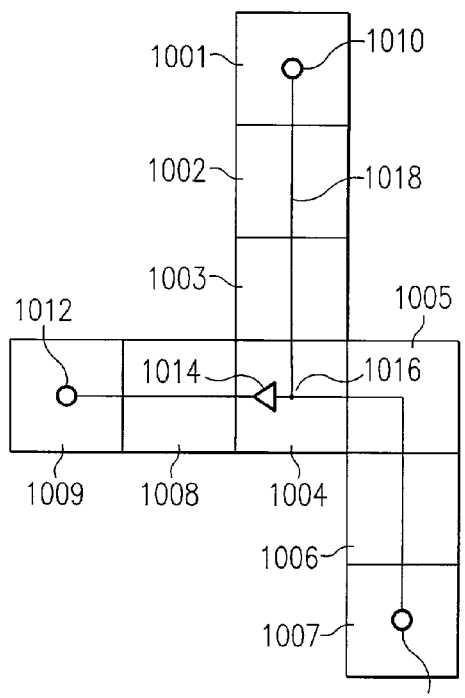
Figure 10C:
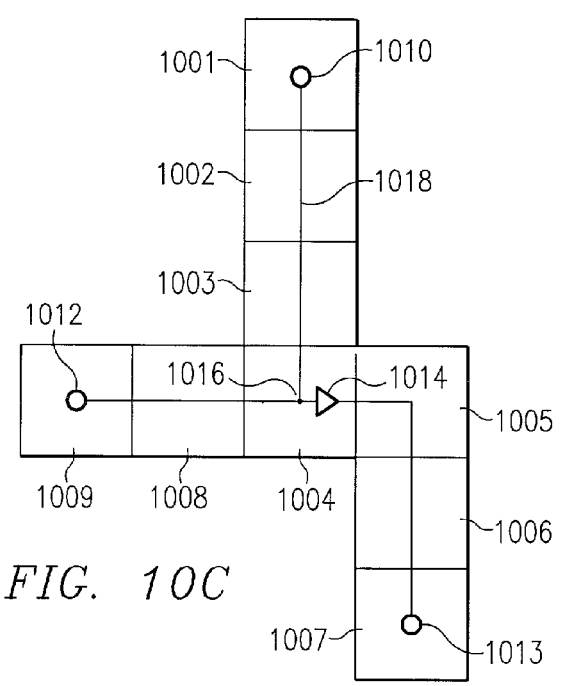

Extending the algorithm to multi-sink nets is fairly straightforward. One still keeps a cost array at each node, but updating the cost becomes a bit trickier when a node has two children. Let l(v) and r(v) denote the cost arrays for the two children of v. If v has only one child, let it be l(v). When considering buffer insertion at a node with two children, there are three cases as shown in FIGS. 10A–10C. Each of FIGS. 10A–10C shows a source 1010 connected to two sinks 1012–1013 via net 1018 with one buffer 1014. The net 1018 spans tiles 1001–1009. The net 1018 diverges at branch point 1016 splitting into a left branch for sink 1012 and a right branch for sink 1013. A buffer 1004 may be used to either drive both branches as depicted in FIG. 10A where the buffer 1014 is placed before the branch point 1016, decouple the left branch as shown in FIG. 10B where the buffer 1014 is placed after branch point 1016 on the left branch of net 1018, or decouple the right branch in FIG. 10C where the buffer 1014 is placed after the branch point 1016 on the right branch of net 1018.

A multi-sink buffer insertion algorithm is shown in FIG. 11 in accordance with the present invention. Algorithm 1100 is an example of a method of implementing step 306 in FIG. 3. The algorithm 1100 flows from the sinks to the source in the same manner as the single-sink algorithm in FIG. 8, except for the inclusion of Step 4. To begin, an unvisited node is picked in step 1. If the unvisited node is a sink, then the cost array is set to zero in step 2. If the node has only one child, then the cost array is set in set 3 in the same manner as in the single child buffer insertion algorithm illustrated in FIG. 8.

The case of two children is handled in step 4. Step 4.1 handles the case where no buffer is inserted at the branch node v. A distance of one is driven for both the left and right branches, hence no buffer implies that the cost array is updated only for indices 2 and above. Step 4.2 handles the case where a buffer is driving both Ha children, taking the combined minimum cost left and right branches. Step 4.3 initializes the cost array for index 1 since it has not yet been set. Finally, Step 4.4 updates the cost array with a better solution from potentially decoupling either of the two branches. Step 5 marks the present node v as visited and picks another unvisited node v such that all descendents of v have been visited and the process is repeated starting with step 1. This process continues until all nodes have been processed. Then, the minimum cost from the cost array is returned as the solution in step 6. Buffer placement is determined by keeping the arrows in the data structure (i.e. store pointers to the previous $L_v[i]$ entry) and upon finishing, tracing back these pointers to uncover the solution. Whenever the pointer points back to an $L_v[0]$ entry, a buffer is inserted in tile v.

This multi-sink buffer insertion algorithm has $O(nL_i^2)$ time complexity due to step 4.2. This algorithm 1100 describes the case of a node having up to two children, however, a node could have up to three children, which yield seven different buffer insertion possibilities. The case of three children is a straightforward extension of the multi-sink algorithm 1100.

Figure 12:
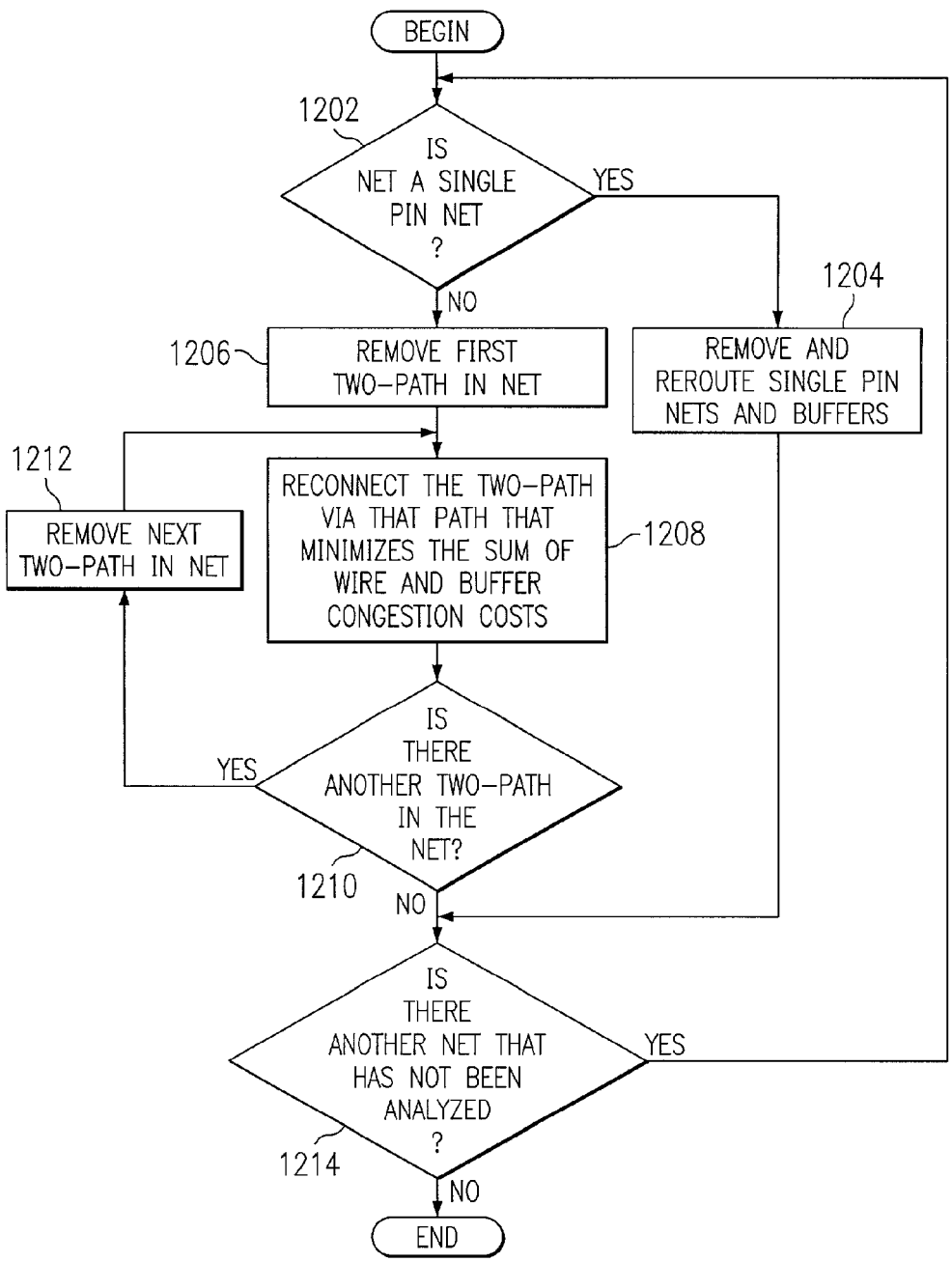
FIG. 12 depicts a flowchart illustrating the final post processing stage of the buffer insertion design process in accordance with the present invention.

With reference now to FIG. 12, a flowchart illustrating the final post processing stage of the buffer insertion design process is depicted in accordance with the present invention. The final post processing stage described in FIG. 12 as an exemplary embodiment for step 308 in FIG. 3. This final post processing stage reduces buffer congestion, wire congestion, and the number of nets which, up until now, have still failed to meet their length constraint. Each net is removed and rerouted, and the buffers for the net are removed as well.

If it is determined that the net is a singe pin net (step 1202), then the net and its associated buffers are removed and rerouted (step 1204). If the net is a multi-pin net, then the net is removed one two-path at a time, where a two-path is a path in the tree which begins and ends at either a Steiner node, source, or sink and contains only vertices of degree two (i.e. a two-path is a path in which every intermediate node in the path has exactly one path going in and one path going out; when there is branching, more than one path going out or coming in, the two-path stops). Thus, the first two-path in the net is removed (step 1206). The two-path is then reconnected via the path that minimizes the sum of wire and buffer congestion costs (step 1208). Next, it is determine whether there is another two-path in the net (step 1210). If there is another two-path in the net, then the next two-path is removed (step 1212) and the process continues at step 1208. If there is not another two-path in the net, then it is determined whether there is another net that has not been analyzed (step 1212). If there is another net that has not been analyzed, then the process continues at step 1202, otherwise the process ends.

The minimum cost of a two-path in step 1208 is computed as follows. For ease of explanation, the endpoint of the original two-path that is in the same sub-tree as the source is referred to as the head and the other endpoint is referred to as the tail. The minimum cost is computed in a bottom-up fashion in a manner similar to the single-sink buffer insertion algorithm depicted in FIG. 8. Starting from the tail, the cost minimization process visits that neighbors of the current minimum cost tile and updates the cost array. For each element in the cost array, a pointer is maintained back to the tile which was used to generate that cost. The cost minimization process iteratively expands the tile with lowest cost and updates the costs of neighboring tiles during wavefront expansion. (This is simply maze routing, a process well known in the art that has been in use since 1961.) The cost for the new tile also includes the wire congestion cost of crossing the tile boundary. Finally, when the head of the two-path is reached, the minimum cost solution is recovered by tracing back out the path to the tail; the buffers used to derive this solution are also inserted during the trace.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media such a floppy disc, a hard disk drive, a RAM, and CD-ROMs and transmission-type media such as digital and analog communications links.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for designing buffer and wire placement in an integrated circuit, the method comprising:
   representing the surface of a integrated circuit design as a tile graph;
   receiving an allocation of buffer locations for selected tiles in the tile graph;
   routing nets between a source and one or more associated sinks; and
   selectively assigning buffer locations within selected tiles based upon buffer needs of the nets, wherein the nets are routed through selected tiles and assigned buffer locations using a cost minimization algorithm, wherein a cost array of the cost minimization algorithm for buffer placement is computed using a single-sink buffer insertion algorithm for one associated sink and a multi-sink insertion algorithm for more then one associated sink, and wherein the selectively assigning step includes computing a cost, q(v), for using a buffer in a particular tile and the cost, q(v), is given by the equation:

$$q(v) = \begin{cases} \dfrac{b(v) + p(v) + 1}{B(v) - b(v)} & \text{if } \dfrac{b(v)}{B(v)} < 1 \\ \infty & \text{otherwise} \end{cases}$$

wherein p(v) is a sum of probabilities for tile v over all unprocessed nets, wherein b(v) is a current number of used buffer sites, and wherein B(v) is a number of buffer sites in tile v.

2. The method as recited in claim 1, the step of routing nets between associated sources and sinks comprises:
   constructing a Steiner tree for each net to determine congested regions; and
   rerouting some of the nets in the congested regions to reduce wire congestion.

3. The method as recited in claim 2, wherein the rerouting some of the nets comprises minimizing the cost of placing a wire across a tile edge wherein the cost is the number of wires that will be crossing the tile edge divided by the number of wires still available for allocation.

4. The method as recited in claim 1, further comprising:
   rerouting and reallocating some of the nets and buffers to reduce wire and buffer congestion and to reduce the number of nets that have failed to meet their length constraint.

5. The method as recited in claim 1, further comprising:
   computing a cost array for buffer placement for a particular net; wherein
   each possible arrangement of buffers is represented by an element in the cost array;
   each element in the array is the sum of costs, q(v), for one possible arrangement of buffers; and
   buffer placement for the particular net corresponds to cost array element having the smallest value.

6. The method as recited in claim 5, the step of computing the cost array is performed for each net in the integrated circuit.

7. The method as recited in claim 1, wherein the selected tiles are less than the total number of tiles in the tile graph.

8. A computer program product in a computer readable media for use in a data processing system for designing buffer and wire placement in an integrated circuit, the computer program product comprising:
- first instructions for representing the surface of a integrated circuit design as a tile graph;
- second instructions for receiving an allocation of buffer locations for selected tiles in the tile graph;
- third instructions for routing nets between a source and one or more associated sinks; and
- fourth instructions for selectively assigning buffer locations within selected tiles based upon buffer needs of the nets, wherein the nets are routed through selected tiles and assigned buffer locations using a cost minimization algorithm, wherein a cost array of the cost minimization algorithm for buffer placement is computed using a single-sink buffer insertion algorithm for one associated sink and a multi-sink insertion algorithm for more than one associated sink, wherein the selectively assigning step includes computing a cost, q(v), for using a buffer in a particular tile and the cost, q(v), is given by the equation:

$$q(v) = \begin{cases} \frac{b(v) + p(v) + 1}{B(v) - b(v)} & \text{if } \frac{b(v)}{B(v)} < 1 \\ \infty & \text{otherwise} \end{cases}$$

wherein p(v) is a sum of probabilities for tile v over all unprocessed nets, wherein b(v) is a current number of used buffer sites, and wherein B(v) is a number of buffer sites in tile v.

9. The computer program product as recited in claim 8, the third instructions comprise:
- fifth instructions for constructing a Steiner tree for each net to determine congested regions; and
- sixth instructions for rerouting some of the nets in the congested regions to reduce wire congestion.

10. The computer program product as recited in claim 9, wherein sixth instructions comprise minimizing the cost of placing a wire across a tile edge wherein the cost is the number of wires that will be crossing the tile edge divided by the number of wires still available.

11. The computer program product as recited in claim 8, further comprising:
- fifth instructions for rerouting and reallocating some of the nets and buffers to reduce wire and buffer congestion and to reduce the number of nets that have failed to meet their length constraint.

12. The computer program product as recited in claim 8, further comprising:
- fifth instructions for computing a cost array for buffer placement for a particular net; wherein
- each possible arrangement of buffers is represented by an element in the cost array;
- each element in the array is the sum of costs, q(v), for one possible arrangement of buffers; and
- buffer placement for the particular net corresponds to cost array element having the smallest value.

13. The computer program product as recited in claim 12, wherein the fifth instructions are performed for each net in the integrated circuit design.

14. The computer program product as recited in claim 8, wherein selected tiles are less than the total number of tiles in the tile graph.

15. A data processing system for designing buffer and wire placement in an integrated circuit, the data processing system comprising:
- a representation unit which represents the surface of a integrated circuit design as a tile graph;
- a buffer placement receiving unit which receives an allocation of buffer locations for selected tiles in the tile graph;
- an initial routing unit which routes nets between a source and one or more associated sinks; and
- a buffer association unit which selectively assigns buffer locations within selected tiles based upon buffer needs of the nets, wherein the nets are routed through selected tiles and assigned buffer locations using a cost minimization algorithm, wherein a cost array of the cost minimization algorithm for buffer placement is computed using a single-sink buffer insertion algorithm for one associated sink and a multi-sink insertion algorithm for more than one associated sink, wherein the selectively assigning step includes computing a cost, q(v), for using a buffer in a particular tile and the cost, q(v), is given by the equation:

$$q(v) = \begin{cases} \frac{b(v) + p(v) + 1}{B(v) - b(v)} & \text{if } \frac{b(v)}{B(v)} < 1 \\ \infty & \text{otherwise} \end{cases}$$

wherein p(v) is a sum for tile probabilities for tile v over all unprocessed nets, wherein b(v) is a current number of used buffer sites, and wherein B(v) is a number of buffer sites in tile v.

16. The data processing system as recited in claim 15, the third instructions comprise:
- a Steiner tree construction unit which constructs a Steiner tree for each net to determine congested regions; and
- a rerouting unit which reroutes some of the nets in the congested regions to reduce wire congestion.

17. The data processing system as recited in claim 16, wherein rerouting unit minimizes the cost of placing a wire across a tile edge wherein the cost is the number of wires that will be crossing the tile edge divided by the number of wires still available.

18. The data processing system as recited in claim 15, further comprising:
- a reallocation unit which reroutes and reallocates some of the nets and buffers to reduce wire and buffer congestion and to reduce the number of nets that have failed to meet their length constraint.

19. The data processing system as recited in claim 15, further comprising:
- a computing unit which computes a cost array for buffer placement for a particular net; wherein each possible arrangement of buffers is represented by an element in the cost array;
- each element in the array is the sum of costs, q(v), for one possible arrangement of buffers; and
- buffer placement for the particular net corresponds to cost array element having the smallest value.

20. The data processing system as recited in claim 19, wherein the computing unit computes the cost array for each net in the integrated circuit design.

21. The data processing system as recited in claim 15, wherein the selected tiles are less than the total number of tiles in the tile graph.

* * * * *

UNITED STATES PATENT AND TRADEMARK OFFICE
CERTIFICATE OF CORRECTION

PATENT NO. : 6,996,512 B2  
APPLICATION NO. : 09/838429  
DATED : February 7, 2006  
INVENTOR(S) : Alpert et al.

Page 1 of 1

It is certified that error appears in the above-identified patent and that said Letters Patent is hereby corrected as shown below:

Col. 11, line 29: after "analyzed" delete "(step 1212)" and insert --(step 1214)--.

Signed and Sealed this

Sixth Day of March, 2007

JON W. DUDAS  
*Director of the United States Patent and Trademark Office*